(12) United States Patent
Haralabidis et al.

(10) Patent No.: US 8,581,362 B2
(45) Date of Patent: Nov. 12, 2013

(54) WIRELESS COMMUNICATION DEVICES WITH IN-PACKAGE INTEGRATED PASSIVE COMPONENTS

(75) Inventors: Nikolaos Haralabidis, Athens (GR); Konstantinos Vavelidis, Ilioupolis (GR); Kosmas-Christos Tsilipanos, Athens (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/409,973

(22) Filed: Mar. 1, 2012

(65) Prior Publication Data

US 2013/0113117 A1    May 9, 2013

Related U.S. Application Data

(60) Provisional application No. 61/556,094, filed on Nov. 4, 2011.

(30) Foreign Application Priority Data

Feb. 8, 2012    (GR) ................................ 20120100086

(51) Int. Cl.
*H01L 23/522*    (2006.01)
(52) U.S. Cl.
USPC ................. 257/528; 257/788; 257/E23.142

(58) Field of Classification Search
USPC .......... 257/528, 686, 700, 704, 788, E23.142
See application file for complete search history.

(56) References Cited

U.S. PATENT DOCUMENTS

| | | | |
|---|---|---|---|
| 8,237,269 B2 * | 8/2012 | Tang et al. | 257/734 |
| 2011/0186980 A1 * | 8/2011 | Lin | 257/690 |

* cited by examiner

*Primary Examiner* — Roy Potter
(74) *Attorney, Agent, or Firm* — Sterne, Kessler, Goldstein & Fox P.L.L.C.

(57) ABSTRACT

Embodiments of the present disclosure can be used to both reduce the size and cost and improve the performance and power consumption of next generation wireless communication devices. In particular, embodiments enable board and semiconductor substrate area savings by using the fabrication package (which encapsulates the semiconductor substrate) as a design element in the design of next generation wireless communication devices. Specifically, embodiments use the substrate of the fabrication package to integrate into it components of the wireless radio transceiver (which are conventionally integrated into the semiconductor substrate) and other discrete components of the communication device (which are conventionally placed on the board of the device). As such, reduced board and semiconductor area can be realized.

20 Claims, 9 Drawing Sheets

WIRELESS COMMUNICATION DEVICES WITH IN-PACKAGE INTEGRATED PASSIVE COMPONENTS

CROSS-REFERENCE TO RELATED APPLICATION(S)

This patent application claims the benefit of U.S. Provisional Patent Application No. 61/556,094, filed Nov. 4, 2011, entitled "Long Term Evolution Radio Frequency Integrated Circuit," which is incorporated herein by reference in its entirety.

BACKGROUND

1. Field of the Invention

The field of the invention relates generally to enhancing the performance and reducing the cost of wireless communication transceivers.

2. Background Art

Strict on-chip and on-board area limitations are faced in the design of next generation wireless communication devices. These limitations are due to the large number of radio frequency (RF) ports (and associated on-chip and on-board circuitry) needed to support multi-standard/multi-band operation and spatial diversity. These area limitations are made even more severe by the demand for increasingly smaller foam factors and improved performance/power consumption. Specifically, smaller form factors place constraints, primarily, on the board size and the area that can be used for on-board components. Improved performance (e.g., lower noise) and power consumption, on the other hand, increase the demand for semiconductor substrate (chip) area by requiring that higher quality factor (Q) passive devices (which are larger in size) be used in various components (e.g., low-noise amplifiers (LNAs), power amplifier (PA) drivers, etc.).

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the subject matter of the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
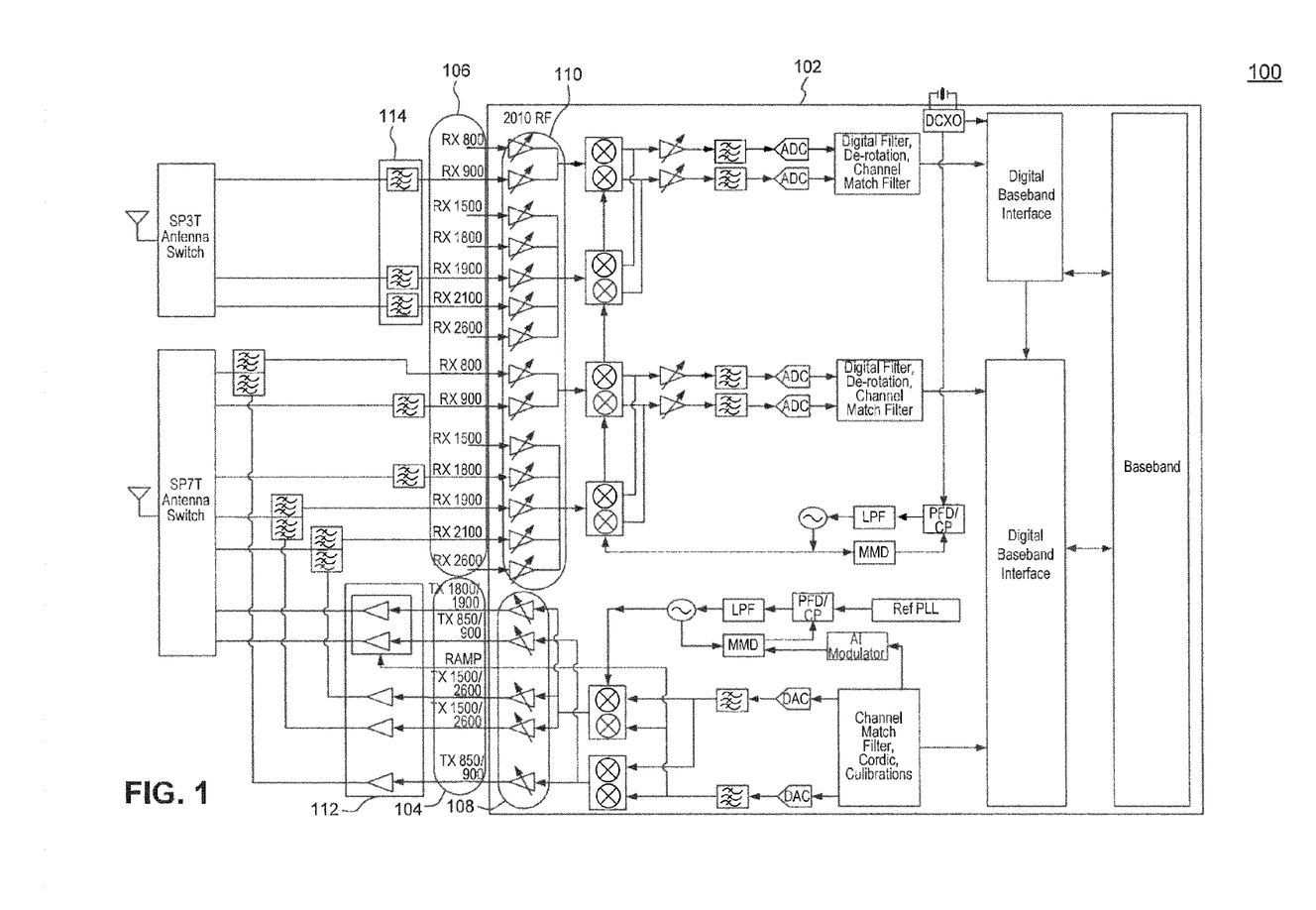
FIG. 1 illustrates an example wireless communication device.

FIG. 1 illustrates an example wireless communication device 100. Example wireless communication device 100 implements a next generation (e.g., Long Term Evolution (LTE)) wireless radio transceiver 102.

To support multi-standard/multi-band operation and spatial diversity, wireless radio transceiver 102 includes large numbers of radio frequency (RF) transmit (TX) ports 104 and RF receive (RX) ports 106. In the example of FIG. 1, wireless radio transceiver 102 includes 14 RX ports and 5 TX ports. In other implementations, wireless radio transceiver 102 may include more RX and/or TX ports. In addition, wireless radio transceiver 102 includes large numbers of power amplifier (PA) driver circuits 108 (each PA driver circuit 108 is coupled to a respective one of TX ports 104) and low-noise amplifiers (LNAs) 110 (each LNA 110 is coupled to a respective one of RX ports 106). Furthermore, each PA driver circuit 108 and each LNA 110 requires a respective impedance matching network (not shown in FIG. 1), typically placed outside of radio transceiver 102.

Conventionally, wireless radio transceiver 102 is implemented, in its entirety, on a semiconductor (e.g., Silicon) substrate as an integrated circuit (IC). Other portions of wireless communication device 100 may be implemented on separate semiconductor substrates (i.e., separate ICs), coupled to the substrate of wireless radio transceiver 102, or as discrete components on a printed circuit board (PCB) (on-board circuitry) of communication device 100. For example, PAs 112 and receive filters 114 are conventionally implemented on separate ICs, known as front-end modules. On the other hand, LNA and PA driver impedance matching networks are conventionally implemented using discrete components placed on the PCB.

As a result of the large numbers of RF ports (and associated on-chip and on-board circuitry), strict on-chip and on-board area requirements are faced in the design of wireless communication device 100. These area requirements are made even more severe by the demand for increasingly smaller form factors and improved performance/power consumption. Specifically, smaller form factors place constraints, primarily, on the board size and the area that can be used for on-board components. Improved performance (e.g., lower noise) and power consumption, on the other hand, increase the demand for semiconductor substrate (chip) area by requiring that higher quality factor (Q) passive devices (which are larger in size) be used in such components as the LNAs, PA drivers, mixers, voltage controlled oscillators (VCOs), and other circuitry of wireless radio transceiver 102.

Embodiments of the present disclosure, as further described below, can be used to both reduce the size and cost and improve the performance and power consumption of next generation wireless communication devices. In particular, embodiments enable board and semiconductor substrate area savings by using the fabrication package (which encapsulates the semiconductor substrate) as a design element in the design of next generation wireless communication devices. Specifically, embodiments use the substrate of the fabrication package that houses the wireless transceiver IC to integrate into it components of the wireless radio transceiver (which are conventionally integrated into the semiconductor substrate) and other discrete components of the communication device (which are conventionally placed on the board of the device). As such, reduced board and semiconductor area can be realized.

Further, design rules (e.g., metal trace thickness, etc.) and properties (e.g., dielectric thickness) of the package substrate allow for larger size, higher Q (with lower parasitics) passive devices to be integrated into the package substrate (compared with the semiconductor substrate). As such, embodiments improve both the performance and power consumption of the wireless communication device. Further, by moving high Q passive devices from the semiconductor substrate to the package substrate, the overall cost of the communication device is reduced since the package substrate material (e.g., FR4) is significantly cheaper than the semiconductor substrate material (e.g., Silicon) and thick top metals of the semiconductor substrate (typically used to construct high Q passive devices) can be eliminated.

Example embodiments of the present disclosure are now presented. These example embodiments are provided for the purpose of illustration only and are not limiting. As would be understood by a person of skill in the art based on the teachings herein, embodiments are not limited by the example wireless transceiver, transmitter, and receiver circuit components described herein. Further, a person of skill in the art would appreciate that embodiments may be applied in devices other than wireless communication devices, in order to reduce the cost/size or improve the performance/power consumption of such devices. As such, embodiments are not limited to wireless communication devices.

Figure 2:
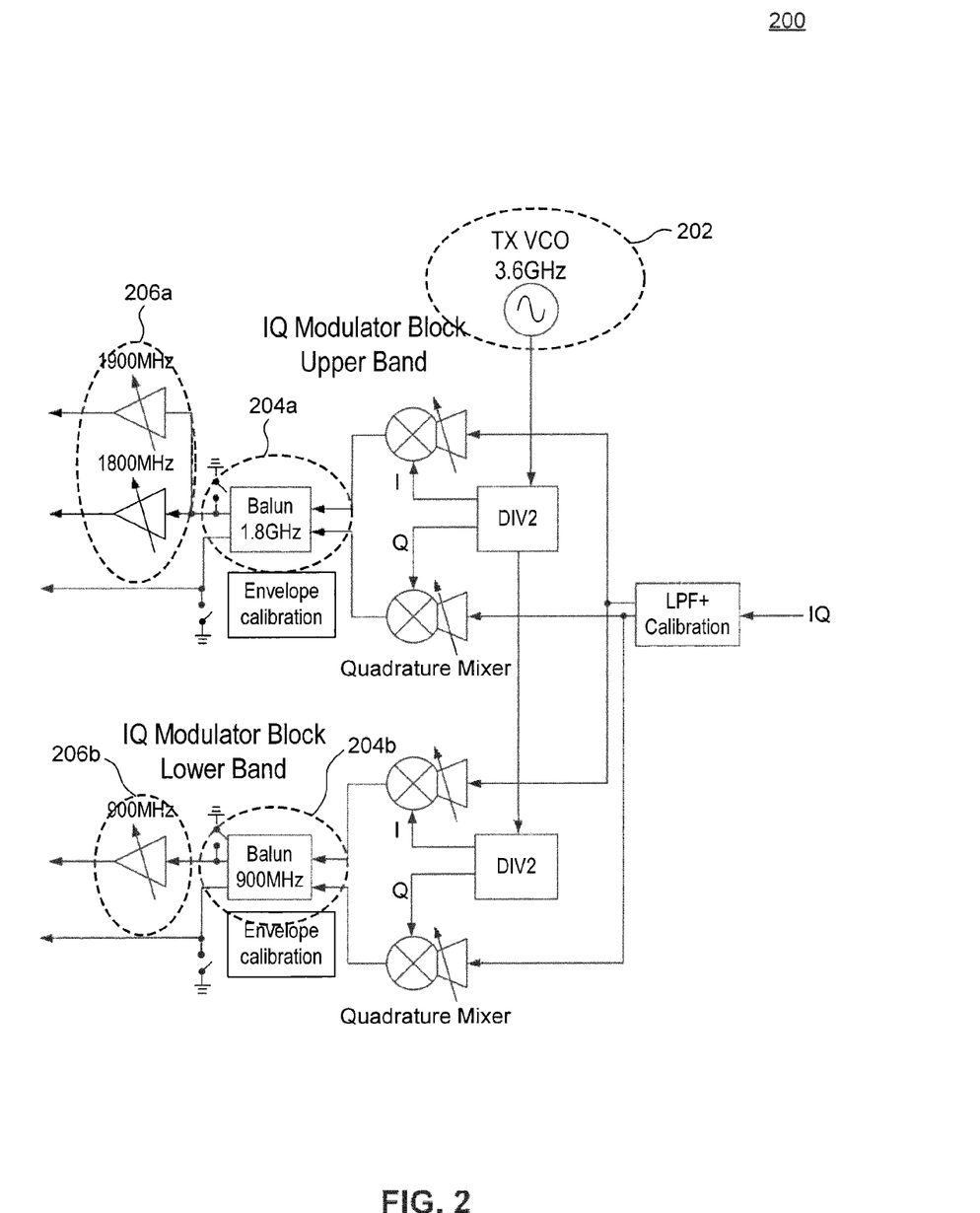
FIG. 2 illustrates a portion of an example radio frequency (RF) transmitter circuit.

FIG. 2 illustrates a portion of an example radio frequency (RF) transmitter circuit 200. Example RF transmitter circuit 200 is provided for the purpose of illustration and is not limiting. As would be understood by a person of skill in the art, example RF transmitter circuit 200 may implement a different architecture than shown in FIG. 2.

Example RF transmitter circuit 200 represents a typical portion of a wireless radio transceiver that benefits from embodiments of the present disclosure. Specifically, example transmitter circuit 200 includes various components that require high Q passive devices for improved power efficiency and noise properties. These components include, for example, a TX VCO 202, TX balun circuits 204a-b, and PA driver circuits 206a-b, as shown in FIG. 2.

Typically, each of these components 202, 204, and 206 requires high Q inductors. According to embodiments, as further described below, the high Q inductors are moved from the semiconductor substrate, where they are conventionally integrated, to the package substrate. As such, each of TX VCO 202, TX balun circuits 204a-b, and PA driver circuits 206a-b may include a portion integrated into the semiconductor substrate and another portion integrated into the package substrate.

Significant performance improvement and cost savings can be realized by moving a high Q inductor from the semiconductor substrate to the package substrate in accordance with embodiments of the present disclosure. For example, in an embodiment, a 250 μm×500 μm on-chip inductor is replaced with a 730 μm×1300 μm on-package inductor. The larger size inductor on the package provides a higher Q and lower parasitics (resistance and capacitance). As such, better performance (e.g., noise properties) and lower power consumption (due to lower parasitics) are achieved. The package substrate material is significantly cheaper than the semiconductor substrate material that significant cost savings are still achieved, despite the larger inductor area on the package.

Figure 3:
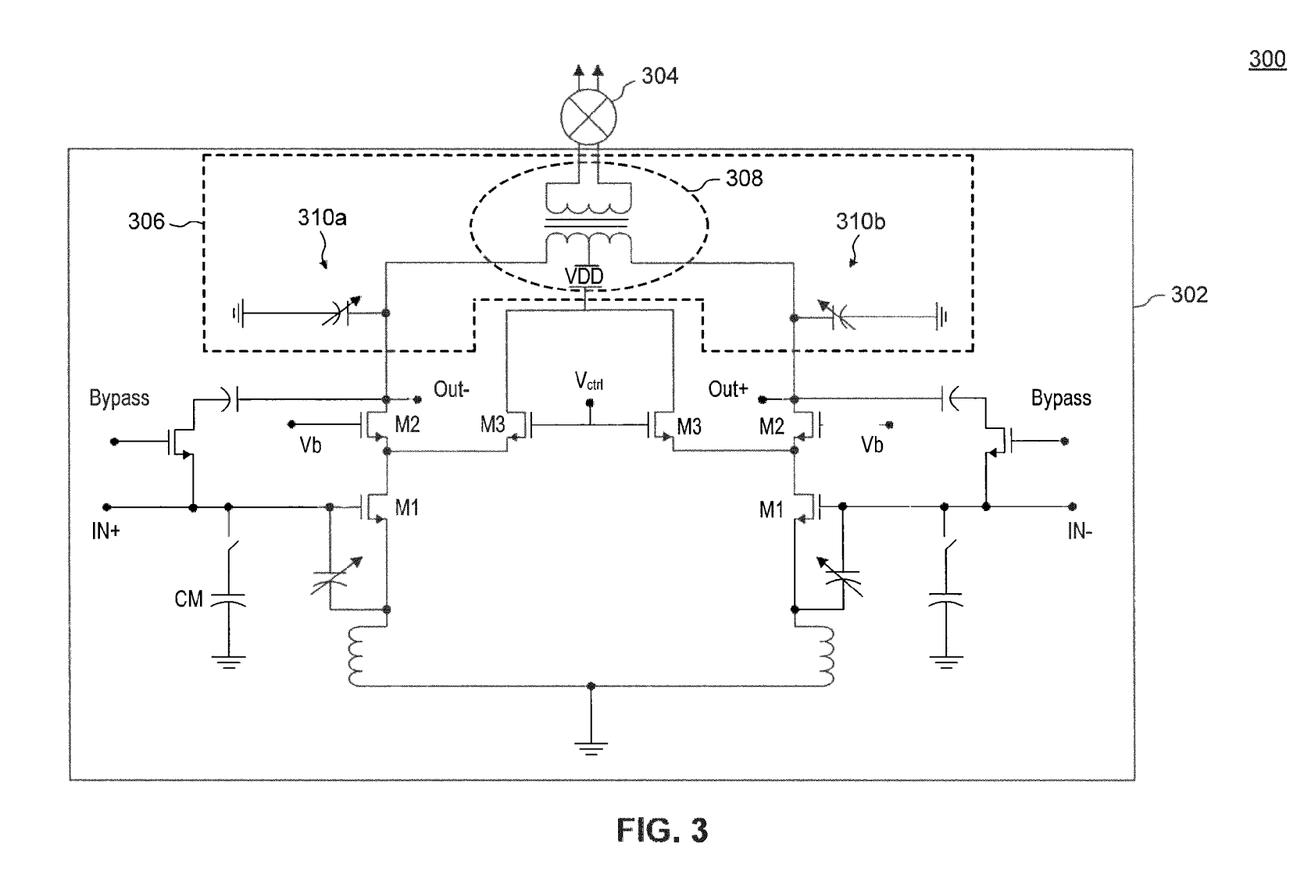
FIG. 3 illustrates an example low noise amplifier (LNA).

FIG. 3 illustrates an example receiver portion 300. Example receiver portion 300 includes a low noise amplifier (LNA) 302 and a mixer 304. Example receiver portion 300 is provided for the purpose of illustration and is not limiting. As would be understood by a person of skill in the art, example receiver portion 300 may implement a different architecture than shown in FIG. 3.

As shown in FIG. 3, LNA 302 includes an output stage 306 that couples LNA 302 to mixer 304. In order to maintain the gain of LNA 302, output stage 306 includes a transformer 308 and tunable capacitors 310a-b. Transformer 308 and tunable capacitors 310a-b form a tunable bandpass filter, which can be selectively centered around a desired center frequency by tuning capacitors 310a-b.

It is desired that the tunable bandpass filter (i.e., output stage 306), formed by transformer 308 and tunable capacitors 310a-b, have a sharp bandwidth definition, in order to reject any unwanted received signals and leaking transmitted signals (especially in the case of frequency division multiplexing (FDD) systems). To realize such sharp bandwidth definition, high Q inductors are required for transformer 308. In addition, it is desired that output stage 306 have low loss in order to maintain adequate signal-to-noise (SNR) at mixer 304.

Embodiments enable LNA 302 to have a low loss, sharp bandwidth output stage 306 by integrating output stage transformer 308 into the substrate of the package that encapsulates the transceiver IC, instead of integrating into the semiconductor substrate (i.e., onto the transceiver IC). In an embodiment, output stage transformer 308 is integrated into one or more metallization layers of the package substrate. By doing so, output stage transformer 308 can be made of larger size, higher Q, and with lower loss. Substantial semiconductor substrate area conventionally allocated for integrating output stage transformer 308 is freed, resulting in cost and area savings.

Figure 4:
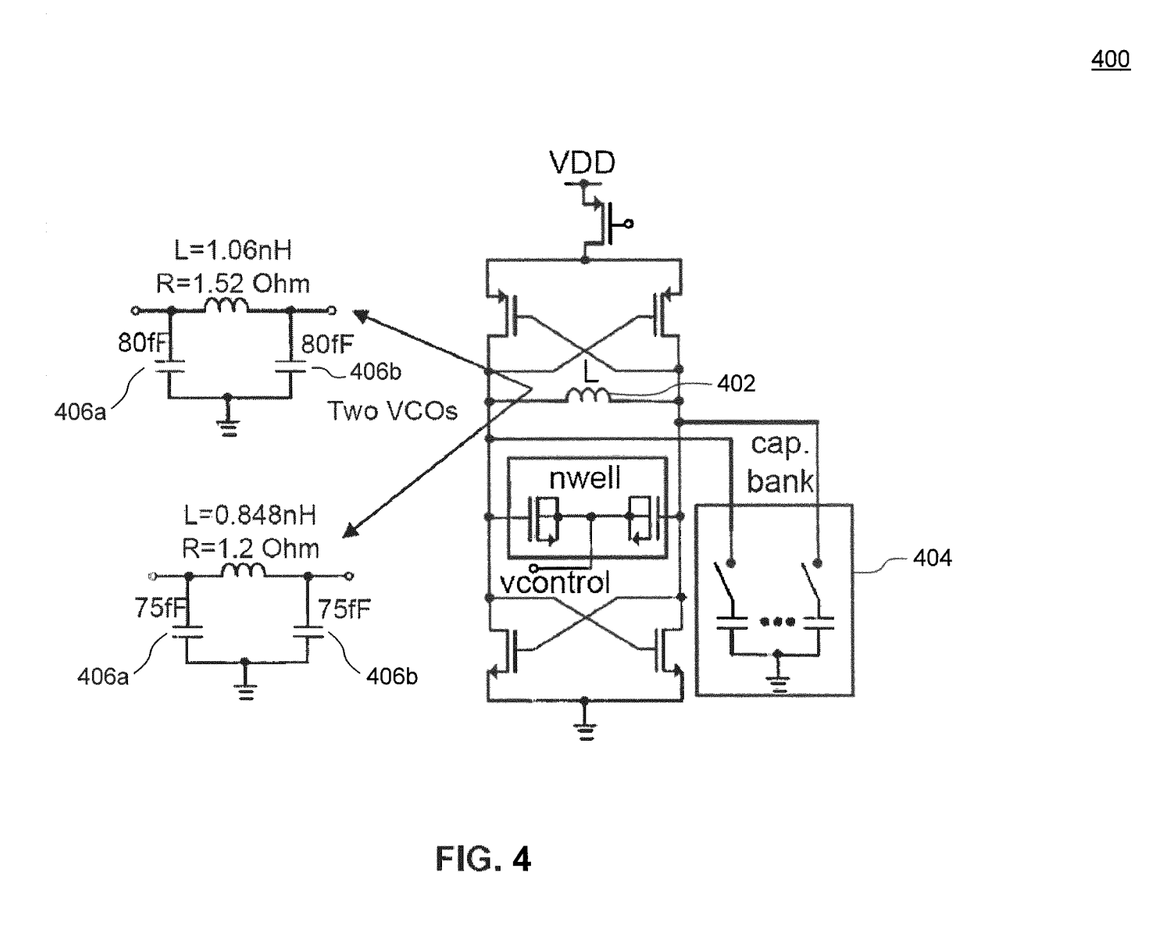
FIG. 4 illustrates an example voltage controlled oscillator (VCO).

FIG. 4 illustrates an example voltage controlled oscillator (VCO) 400. Example VCO 400 is provided for the purpose of illustration and is not limiting. As would be understood by a person of skill in the art, example VCO 400 may implement a different architecture than shown in FIG. 4. Example VCO 400 may be an embodiment of TX VCO 202 of example RF transmitter circuit 200.

As shown in FIG. 4, example VCO 400 includes an LC circuit that includes an inductor 402 coupled in parallel to a capacitor bank 404. The output frequency of VCO 400 is determined by the resonant frequency of the LC circuit, which can be controlled by switching in/out capacitors in capacitor bank 404.

In order to have low noise and high performance, inductor 402 is required to be large, of high Q, and to have low parasitics. FIG. 4 illustrates two exemplary implementations of inductor 402, one for low-band operation (e.g., 1800 MHz) and one for high-band VCO operation (e.g., 4 GHz). As shown in FIG. 4, the values of inductor 402 (e.g., 1.06 nH and 0.848 nH) are fairly large for wireless communication applications. In addition, when implemented on the semiconductor substrate (i.e., within the transceiver chip), inductor 402 has relatively large parasitic capacitances 406a-b (e.g., 75-80 fF).

According to embodiments, VCO 400 is implemented with inductor 402 integrated into the package substrate of the transceiver IC package, and the remaining components of VCO 400 integrated into the semiconductor substrate. In an embodiment, inductor 402 is integrated into one or more metallization layers of the package substrate. As such, inductor 402 can be made as large as required to achieve the desired performance (e.g., Q). Integration into the package substrate further allows inductor 402 to have lower parasitic capacitances 406a-b, which further improves its performance and current consumption by also requiring less quiescent (DC) current on the VCO circuit itself.

In an example implementation, VCO 400 with inductor 402 integrated into the semiconductor substrate (i.e., VCO 400 integrated entirely into the semiconductor substrate) results in ~15 mA of current consumption, a phase noise (PN)

@20 MHz of −157 dBc/Hz, and a peak-to-peak differential swing of ~4.3 V. For the same current consumption (i.e., 15 mA), in an embodiment, the PN of VCO 400 is improved by 2 dB (i.e., to −159 dBc/Hz) and the swing of VCO 400 is increased to ~4.9 V by integrating inductor 402 into the package substrate. For the same PN (i.e., −156 dBc/Hz), in another embodiment, the current consumption of VCO 400 is reduced to 8.6 mA (by approximately 43%) by integrating inductor 402 into the package substrate.

Figure 5:
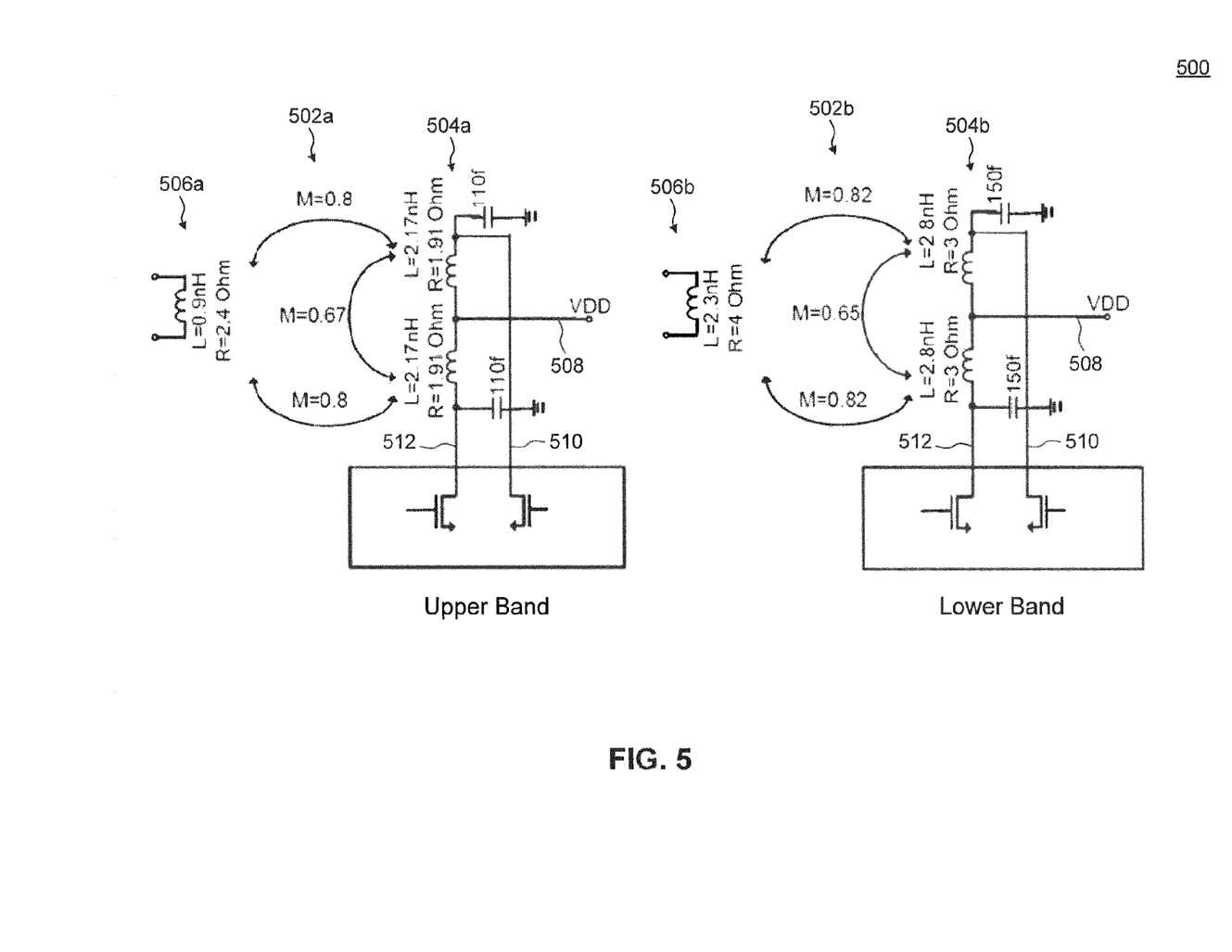
FIG. 5 illustrates example transmit balun circuits.

FIG. 5 illustrates example transmit (TX) balun circuits 502a and 502b. TX balun circuits 502a and 502b may be embodiments of TX balun circuits 204a and 204b, respectively, of example RF transmitter circuit 200. TX balun circuits 502a and 502b are provided for the purpose of illustration and are not limiting. As would be understood by a person of skill in the art, TX balun circuits 502a and 502b may implement a different architecture than shown in FIG. 5.

As shown in FIG. 5, each of TX balun circuits 502a-b includes a transformer having a primary (input) inductor 504 and a secondary (output) inductor 506. A differential current output of a TX mixer, comprising signals 510 and 512, is provided to primary inductor 504, along with a supply voltage VDD 508 coupled to a center tap of inductor 504. The differential TX mixer current output 510-512 drives primary inductor 504 and is transformed into a single-ended current in secondary inductor 506.

When integrated into the semiconductor substrate (as done conventionally), the transformers of TX balun circuits 502a-b have large resistive and capacitive parasitics. For example, as shown in FIG. 5, primary inductor 504a has about 4 Ohms of parasitic resistance in series with its inductance. This significantly lowers the Q of the transformers, resulting in a large loss of TX output power.

According to embodiments, one or more of the transformers of TX balun circuits 502a-b are integrated into the substrate of the transceiver IC package. In an embodiment, the transformers are integrated into one or more metallization layers of the package substrate. By doing so, resistive parasitics are reduced to approximately one third of their chip integrated values, resulting in significantly higher power transfer from primary inductor 504 to secondary inductor 506 and from secondary inductor 506 to subsequent transmitter circuitry (e.g., driver circuit). For example, dielectric thickness in the package substrate (which is an order of magnitude larger than in the semiconductor substrate) allows for an inductor integrated into the package to have twice the size of an inductor integrated into the semiconductor substrate, without increased capacitive or resistive parasitics.

Figure 6:
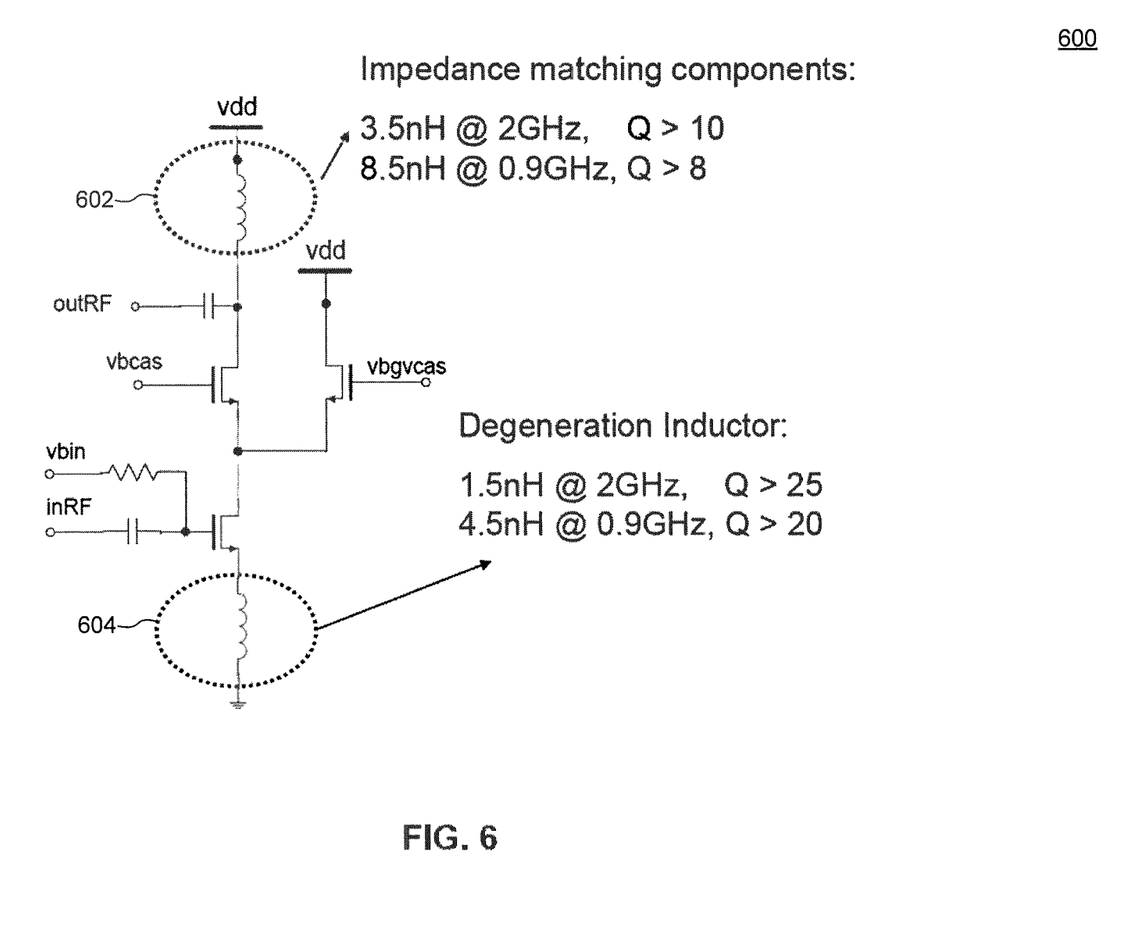
FIG. 6 illustrates an example power amplifier (PA) driver circuit.

FIG. 6 illustrates an example power amplifier (PA) driver circuit 600. PA driver circuit 600 may be an embodiment of PA driver circuits 206a-b of example RF transmitter circuit 200. PA driver circuit 600 is provided for the purpose of illustration and is not limiting. As would be understood by a person of skill in the art, PA driver circuit 600 may implement a different architecture than shown in FIG. 6.

As shown in FIG. 6, PA driver circuit 600 includes an impedance matching inductor 602 and a degeneration inductor 604. Typically, inductors 602 and 604 are desired to have relatively large inductance and Q factor values. Typical desired inductance and Q factor requirements for inductors 602 and 604 are shown in FIG. 6 for the example cases of 0.9 GHz and 2 GHz.

When integrated in a semiconductor substrate, as done conventionally, inductors 602 and 604 require a large area to achieve typical inductance and Q factor requirements. Implementing inductors 602 and 604 over a smaller area by using thinner spirals, for example, results in increased resistance and higher loss (lower Q). Accordingly, it is quite challenging to integrate inductors 602 and 604 into the semiconductor substrate in an area efficient manner while meeting desired inductance and Q factor values.

According to embodiments, one or more of inductors 602 and 604 is integrated into the package substrate of the transceiver IC package. In an embodiment, one or more of inductors 602 and 604 are integrated into one or more metallization layers of the package substrate. Accordingly, inductors 602 and 604 may be implemented with relaxed area requirements, resulting in inductors with larger inductance values, lower resistance, and higher Q factors, which meet desired inductance and Q factor requirements as described above. A sizeable area of the semiconductor substrate is also freed by moving inductors 602 and 604 into the package substrate.

Figure 7:
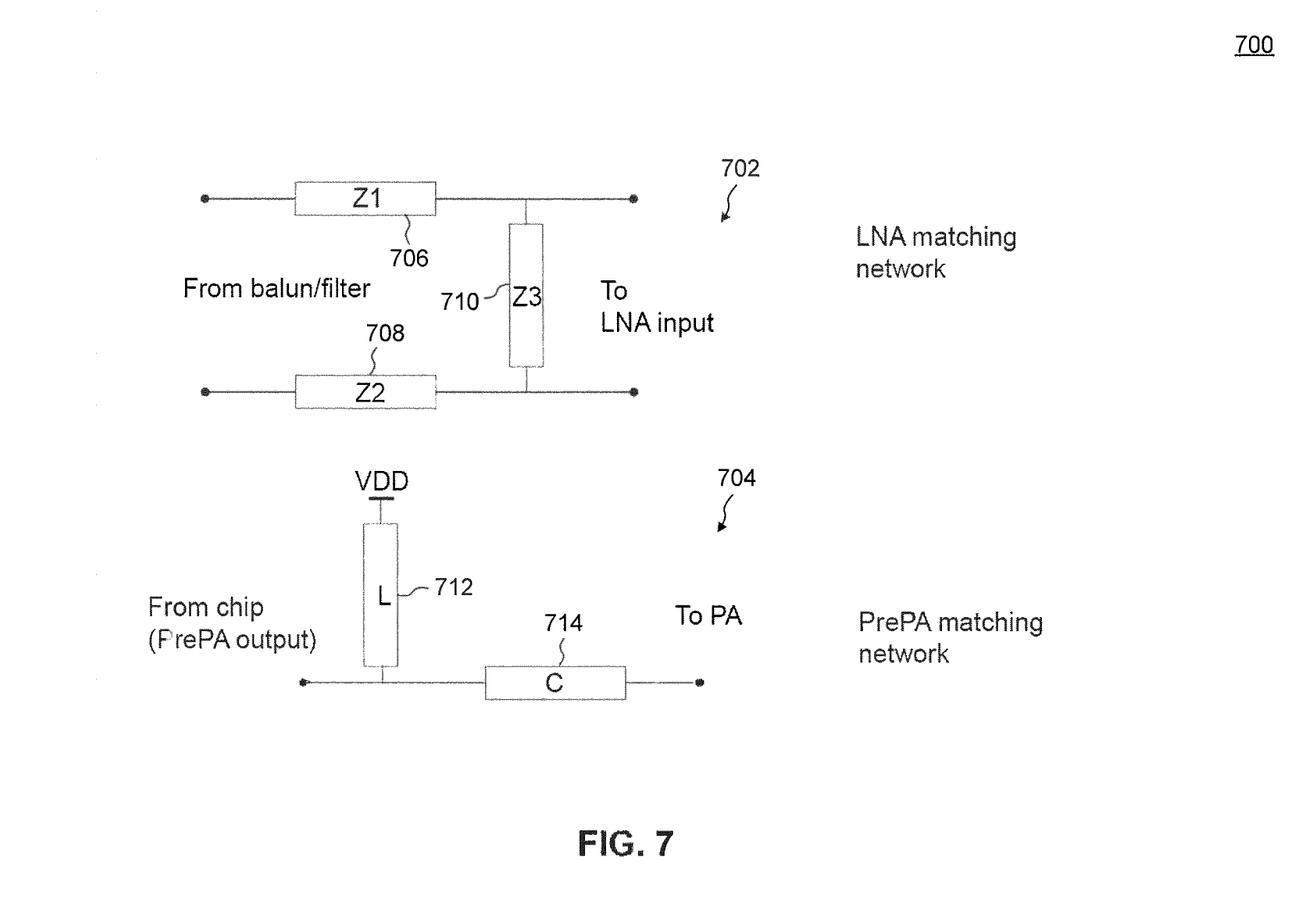
FIG. 7 illustrates example RF impedance matching networks.

FIG. 7 illustrates example RF impedance matching networks 702 and 704. RF impedance matching networks 702 and 704 are provided for the purpose of illustration and are not limiting. As would be understood by a person of skill in the art, RF impedance networks 702 and 704 may implement different architectures than shown in FIG. 7.

Impedance matching networks 702 and 704 represent a LNA impedance matching network and a driver circuit (PrePA) impedance matching network, respectively. Typically, impedance matching network 702 sits between a receive balun/filter (typically, outside the transceiver chip) and a respective LNA (on the transceiver chip). For example, impedance matching network 702 sits between the receive balun/filter and a RF receive port of the transceiver chip, coupled to the LNA input. Impedance matching network 704 sits between a respective driver circuit and the PA (typically, outside the transceiver chip). For example, impedance matching network 704 couples a RF transmit port of the transceiver chip (coupled to the output of the driver circuit) and the PA. Thus, conventionally, impedance matching networks 702 and 704 are implemented using discrete components placed on the PCB.

As shown in FIG. 7, impedance matching network 702 includes impedances 706, 708, and 710. Impedance matching network 704 includes an inductor 712 and a capacitor 714. In a radio transceiver with multiple transmit/receive ports, a separate PrePA/LNA matching network is required for each transmit/receive port. For example, referring to example transceiver 102 of FIG. 1, each PA driver circuit 108 and each LNA 110 requires a respective impedance matching network (not shown in FIG. 1). As such, as the number of transmit/receive ports increases, the number of external components placed on the PCB increases linearly, requiring significant board space. For example, in the case of example communication device 100, which has 14 receive ports and 5 transmit ports, more than 50 external components are needed for the LNA and PA driver matching networks.

According to embodiments, impedance matching networks 702 and 704 are integrated into the substrate of the package housing the transceiver IC. In an embodiment, impedance matching networks 702 and 704 are integrated into one or more metallization layers of the package substrate. As a result, significant board space is freed and smaller form factors for the communication device can be achieved.

Figure 8:
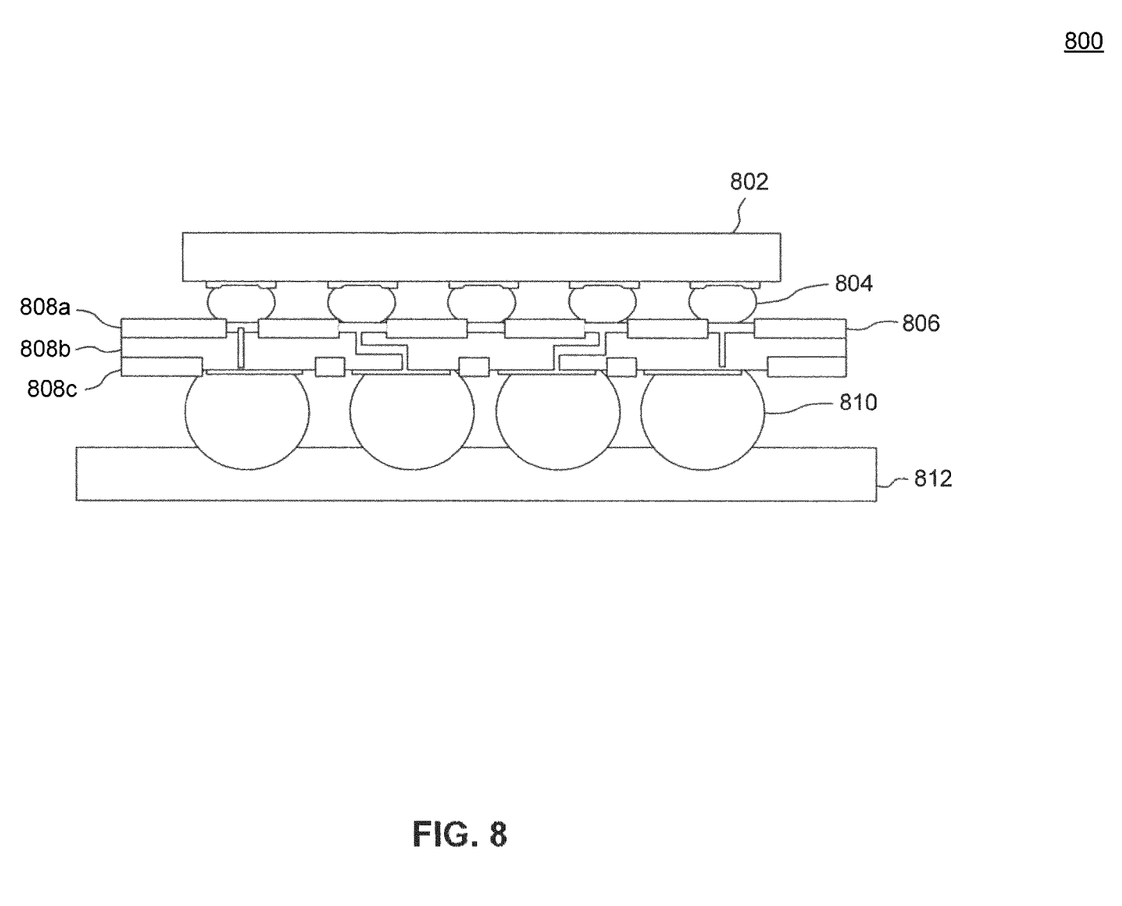
FIG. 8 is a cross-section of an example device implementation.

FIG. 8 is a cross-section of an example device implementation 800. Example implementation 800 is provided for the purpose of illustration and is not limiting. Example implementation 800 may be used to implement embodiments of the present disclosure, such as wireless communication device 100, for example. As shown in FIG. 8, example implementation 800 includes a semiconductor substrate 802, a package substrate 806, and a PCB 812.

Semiconductor substrate 802 is interconnected to package substrate 806 through metal bumps 804 (flip-chip design). In another embodiment, semiconductor substrate 802 is wire bonded to package substrate 806 instead of, or in addition to, metal bumps 804. Typically, a large portion of the device functional blocks are integrated into semiconductor substrate 802.

Package substrate 806 is the bottom part of a package/case that encapsulates semiconductor substrate 802. Package substrate 806 is interconnected to PCB 812 through solder balls 810 (e.g., that form a ball grid array (BGA)). Package substrate 806 includes three metallization layers, a top layer 808a, a middle layer 808b, and a bottom layer 808c. In other embodiments, package substrate 806 may include more or less metallization layers than in example implementation 800.

In embodiments, package substrate 806 is used to integrate one or more passive devices required by the device. For example, for a wireless communication device, such as example device 100, package substrate 806 can be used to integrate one or more of the passive devices used in such components as LNAs, TX balun circuits, PA drivers, mixers, VCOs, etc, (conventionally integrated into semiconductor substrate 802). In addition, package substrate 806 can be used to integrate impedance matching networks (e.g., LNA and driver matching networks), which are conventionally implemented as discrete components on PCB 812. Each of the passive devices/networks may be integrated into one or more of metallization layers 808a, 808b, and 808c of package substrate 806.

When embodiments are used, for some or all of the LNAs, TX balun circuits, PA drivers, mixers, VCOs, etc., the respective circuit may include one portion integrated into semiconductor substrate 802 and another portion integrated into package substrate 806. The two portions of the circuit are electrically coupled through interconnecting signals routed via metal bumps 804 and/or wirebonds, which interconnect semiconductor substrate 802 and package substrate 806.

Figure 9:
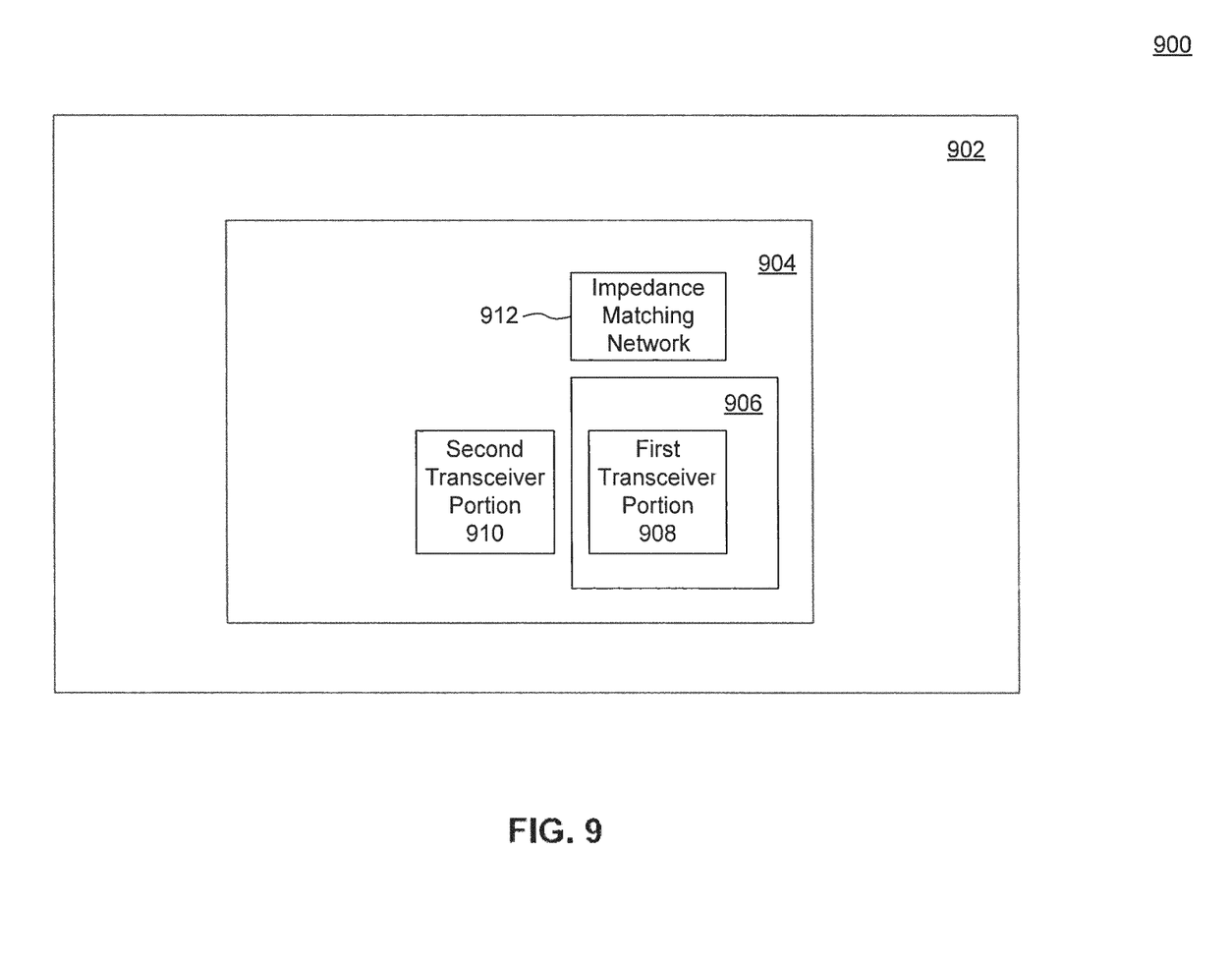
FIG. 9 is a top view of an example communication device implementation.

FIG. 9 is a top view of an example wireless communication device implementation 900. Example implementation 900 is provided for the purpose of illustration and is not limiting. Example implementation 900 may be used to implement embodiments of the present disclosure, such as wireless communication device 100, for example.

Example implementation 900 includes an integrated circuit (IC) package 904, located on a printed circuit board (PCB) 902 of the wireless communication device. IC package 904 has a package substrate (bottom). In an embodiment, the package substrate is a multi-layer substrate having a plurality of metallization layers. A semiconductor substrate 906 is formed on top of the package substrate and is encapsulated inside IC package 904 (i.e., IC package 904 forms a housing for semiconductor substrate 906). In an embodiment, the package substrate and semiconductor substrate 906 are of different material types.

In an embodiment, a transceiver circuit has a first portion 908 integrated into semiconductor substrate 906 and a second portion 910 integrated into the package substrate. Second portion 910 may be integrated into one or more of the plurality of metallization layers of the package substrate of IC package 904. In embodiments, first portion 908 and second portion 910 of the transceiver circuit form at least one of a low-noise amplifier (LNA) circuit, a voltage controlled oscillator (VCO) circuit, a transmit (TX) balun circuit, and a power amplifier (PA) driver circuit. Second portion 910 may include one or more of an output stage transformer of the LNA circuit, an inductor of the VCO circuit, a transformer of the TX balun circuit, at least one of an impedance matching inductor and a degeneration inductor of the PA driver circuit. As would be understood by a person skilled in the art based on the teachings herein, other types of circuits could be implemented for first portion 908 and second portion 910.

In another embodiment, the transceiver circuit further includes at least one RF port. An impedance matching network 912, coupled to the at least one port of the transceiver circuit, is integrated into the package substrate of IC package 904. Impedance matching network 912 may be integrated into one or more of the plurality of metallization layers of the package substrate. In an embodiment, the RF port of the transceiver circuit is a transmit port, and impedance matching network 912 includes a PA driver impedance matching network. In another embodiment, the RF port of the transceiver circuit is a receive port, and impedance matching network 912 includes LNA impedance matching network.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. An integrated circuit (IC) package, comprising:
   a package substrate;
   a semiconductor substrate, formed on top of the package substrate and encapsulated inside the IC package; and
   a transceiver circuit having a first portion integrated into the semiconductor substrate and a second portion integrated into the package substrate,
   wherein the first portion and the second portion of the transceiver circuit form at least one of a low-noise amplifier (LNA) circuit, a voltage controlled oscillator (VCO) circuit, a transmit (TX) balun circuit, and a power amplifier (PA) driver circuit.

2. The IC package of claim 1, wherein the package substrate and the semiconductor substrate are of different material types.

3. The IC package of claim 1, wherein the package substrate is a multi-layer substrate having a plurality of metallization layers.

4. The IC package of claim 3, wherein the second portion of the transceiver circuit is integrated into one or more of the plurality of metallization layers of the package substrate.

5. The IC package of claim 1, wherein the second portion of the transceiver circuit includes an inductor.

6. The IC package of claim 1, wherein the first portion and the second portion of the transceiver circuit form the LNA circuit, and wherein the second portion includes an output stage transformer of the LNA circuit.

7. The IC package of claim 1, wherein the first portion and the second portion of the transceiver circuit form the VCO circuit, and wherein the second portion includes an inductor of the VCO circuit.

8. The IC package of claim 1, wherein the first portion and the second portion of the transceiver circuit form the TX balun circuit, and wherein the second portion includes a transformer of the TX balun circuit.

9. The IC package of claim 1, wherein the first portion and the second portion of the transceiver circuit form the PA driver circuit, and wherein the second portion includes at least one of an impedance matching inductor and a degeneration inductor of the PA driver circuit.

10. The IC package of claim 1, wherein the second portion of the transceiver circuit includes at least one passive component.

11. A transceiver circuit, comprising:
a first portion integrated into a semiconductor substrate; and
a second portion, coupled to the first portion, integrated into a package substrate of a package that encapsulates the semiconductor substrate,
wherein the first portion and the second portion form at least one of a low-noise an (LNA) circuit, a voltage controlled oscillator (VCO) circuit, a transmit (TX) balun circuit, and a power amplifier (PA) driver circuit of the transceiver circuit.

12. The transceiver circuit of claim 11, wherein the second portion includes at least one passive component.

13. The transceiver circuit of claim 11, wherein the second portion includes an inductor.

14. The transceiver circuit of claim 11, wherein the second portion includes at least one of an output stage transformer of the LNA circuit, an inductor of the VCO circuit, a transformer of the TX balun circuit, and an inductor of the PA driver circuit.

15. An integrated circuit (IC) package, comprising:
a package substrate;
a semiconductor substrate, formed on top of the package substrate and encapsulated inside the IC package;
a transceiver circuit, integrated into the semiconductor substrate, having at least one port; and
an impedance matching network, coupled to the at least one port of the transceiver circuit, integrated into the package substrate of the IC package.

16. The IC package of claim 15, wherein the at least one port include a transmit port of the transceiver circuit, and wherein the impedance matching network includes a power amplifier (PA) driver impedance matching network.

17. The IC package of claim 15, wherein the at least one port include a receive port of the transceiver circuit, and wherein the impedance matching network includes a low-noise amplifier (LNA) impedance matching network.

18. The IC package of claim 15, wherein the package substrate and the semiconductor substrate are of different material types.

19. The IC package of claim 15, wherein the package substrate is a multi-layer substrate having a plurality of metallization layers.

20. The IC package of claim 19, wherein the impedance matching network is integrated into one or more of the plurality of metallization layers of the package substrate.

* * * * *

UNITED STATES PATENT AND TRADEMARK OFFICE
CERTIFICATE OF CORRECTION

PATENT NO. : 8,581,362 B2
APPLICATION NO. : 13/409973
DATED : November 12, 2013
INVENTOR(S) : Haralabidis et al.

It is certified that error appears in the above-identified patent and that said Letters Patent is hereby corrected as shown below:

In the Claims

Claim 11, Column 9, line 29 "low-noise an" should be replaced with --low-noise amplifier--.

Signed and Sealed this
Fourth Day of February, 2014

Michelle K. Lee
*Deputy Director of the United States Patent and Trademark Office*